(12) United States Patent
Abbasfar et al.

(10) Patent No.: US 12,015,423 B2
(45) Date of Patent: *Jun. 18, 2024

(54) SYSTEMS AND METHODS FOR DECODING TRANSITION ENCODED DATA WITH PROTECTED KEY

(71) Applicant: Samsung Display Co., Ltd., Yongin-si (KR)

(72) Inventors: Aliazam Abbasfar, Santa Clara, CA (US); Amir Amirkhany, Sunnyvale, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/329,429

(22) Filed: Jun. 5, 2023

(65) Prior Publication Data

US 2023/0318623 A1 Oct. 5, 2023

Related U.S. Application Data

(63) Continuation of application No. 17/516,604, filed on Nov. 1, 2021, now Pat. No. 11,695,429.

(60) Provisional application No. 63/227,278, filed on Jul. 29, 2021.

(51) Int. Cl.
*H03M 13/11* (2006.01)
*H03M 13/35* (2006.01)
*H04L 1/00* (2006.01)

(52) U.S. Cl.
CPC .......... *H03M 13/11* (2013.01); *H03M 13/356* (2013.01); *H04L 1/0041* (2013.01); *H04L 1/007* (2013.01); *H04L 1/0086* (2013.01)

(58) Field of Classification Search
CPC ... H03M 13/11; H03M 13/356; H04L 1/0041; H04L 1/007; H04L 1/0086
See application file for complete search history.

(56) References Cited

U.S. PATENT DOCUMENTS

| | | | |
|---|---|---|---|
| 5,349,589 A | 9/1994 | Chennakeshu et al. | |
| 5,878,061 A | 3/1999 | Hauck et al. | |
| 7,149,955 B1 | 12/2006 | Sutardja et al. | |
| 7,392,464 B1 | 6/2008 | Feng et al. | |
| 8,078,935 B2 | 12/2011 | Cai et al. | |
| 9,166,769 B2 | 10/2015 | Lee | |
| 9,319,179 B1 | 4/2016 | Ahirwar et al. | |
| 9,459,955 B2 * | 10/2016 | Tuers | G06F 11/1012 |
| 9,658,921 B2 | 5/2017 | Kamali et al. | |
| 9,729,681 B2 | 8/2017 | Lee | |
| 9,864,654 B2 * | 1/2018 | Vishne | G06F 11/1048 |

(Continued)

*Primary Examiner* — Justin R Knapp
(74) *Attorney, Agent, or Firm* — Lewis Roca Rothgerber Christie LLP

(57) ABSTRACT

A method for encoding may include receiving, at an encoder, a series of data bits, performing, at the encoder, first transition encoding on the data bits to generate an encoded series of data bits based on a key, performing, at the encoder, protection encoding on the key to generate key protection data, performing, at the encoder, second transition encoding on the key protection data to generate encoded key protection data, and transmitting an encoded series of transmission bits to a receiver, the encoded series of transmission bits including the encoded series of data bits and the encoded key protection data.

20 Claims, 5 Drawing Sheets

(56) References Cited

U.S. PATENT DOCUMENTS

| | | |
|---|---|---|
| 11,165,444 B2 | 11/2021 | Dodds |
| 2013/0315397 A1 | 11/2013 | Tuers et al. |
| 2017/0169255 A1 | 6/2017 | Lin et al. |
| 2018/0137061 A1 | 5/2018 | Peeters et al. |
| 2020/0089625 A1* | 3/2020 | Wallach ................ G06F 21/602 |

* cited by examiner

| p1b | p2b | d1 | d2 | d3 | d4 | d5 | p3b | p4b |
|---|---|---|---|---|---|---|---|---|
| 1 | 1 | 0 | 0 | 0 | 0 | 1 | 0 | 0 |
| 1 | 0 | 0 | 0 | 0 | 1 | 1 | 1 | 0 |
| 0 | 0 | 0 | 0 | 1 | 0 | 1 | 1 | 1 |
| 0 | 1 | 0 | 0 | 1 | 1 | 1 | 0 | 1 |
| 0 | 1 | 0 | 1 | 0 | 0 | 1 | 0 | 1 |
| 1 | 0 | 0 | 1 | 1 | 1 | 1 | 1 | 1 |
| 1 | 0 | 0 | 1 | 0 | 0 | 1 | 1 | 0 |
| 0 | 1 | 1 | 0 | 0 | 1 | 1 | 0 | 0 |
| 0 | 0 | 1 | 0 | 1 | 0 | 1 | 1 | 0 |
| 1 | 1 | 1 | 0 | 0 | 0 | 1 | 1 | 0 |
| 1 | 0 | 1 | 1 | 0 | 1 | 1 | 0 | 1 |
| 1 | 1 | 1 | 1 | 0 | 0 | 1 | 1 | 1 |
| 1 | 1 | 1 | 1 | 1 | 1 | 1 | 1 | 1 |
| 0 | 1 | 1 | 1 | 0 | 0 | 1 | 1 | 0 |
| 0 | 0 | 1 | 1 | 1 | 1 | 1 | 0 | 0 |

| p1b | p2b | d1 | d2 | d3 | d4 | d5 | p3b | p4b |
|---|---|---|---|---|---|---|---|---|
| 1 | 1 | 0 | 0 | 0 | 0 | 0 | 1 | 1 |
| 1 | 0 | 0 | 0 | 1 | 1 | 0 | 0 | 1 |
| 0 | 0 | 0 | 0 | 1 | 0 | 0 | 1 | 0 |
| 0 | 1 | 0 | 1 | 0 | 1 | 0 | 1 | 0 |
| 0 | 1 | 0 | 1 | 0 | 0 | 0 | 0 | 0 |
| 1 | 0 | 0 | 1 | 1 | 1 | 0 | 1 | 1 |
| 1 | 0 | 1 | 1 | 1 | 0 | 0 | 1 | 1 |
| 0 | 1 | 1 | 0 | 0 | 1 | 0 | 0 | 0 |
| 0 | 0 | 1 | 0 | 1 | 0 | 0 | 0 | 0 |
| 1 | 1 | 1 | 0 | 1 | 1 | 0 | 1 | 0 |
| 1 | 0 | 1 | 1 | 0 | 0 | 0 | 1 | 0 |
| 1 | 1 | 1 | 1 | 0 | 1 | 0 | 0 | 0 |
| 1 | 1 | 1 | 1 | 1 | 0 | 0 | 1 | 1 |
| 0 | 1 | 1 | 1 | 1 | 0 | 0 | 1 | 1 |
| 0 | 0 | 1 | 1 | 1 | 1 | 0 | 0 | 0 |

FIG. 2

SYSTEMS AND METHODS FOR DECODING TRANSITION ENCODED DATA WITH PROTECTED KEY

CROSS-REFERENCE TO RELATED APPLICATION(S)

This application is a continuation of U.S. patent application Ser. No. 17/516,604, filed Nov. 1, 2021, which claims priority to and the benefit of U.S. Provisional Patent Application No. 63/227,278, filed on Jul. 29, 2021, which is incorporated herein by reference in its entirety.

FIELD

The present application generally relates to transition encoding, and more particularly to systems and methods for transition encoding with protected key.

BACKGROUND

Electronic devices that use serial data transmission rely on error-free information being provided from the transmitter to the receiver. Furthermore, some serial data transmission techniques rely on a key to encode and then to decode the serial data. Because the encoding and the decoding processes rely on the key, if an incorrect or erroneous key is received by the receiver, then the error from the key propagates to the data and, the serial data cannot be properly decoded. Consequently, techniques for ensuring reliability and integrity of the key are desired.

SUMMARY

According to some embodiments, a method for encoding is described. The method may include: receiving, at an encoder, a series of data bits, performing, at the encoder, first transition encoding on the data bits to generate an encoded series of data bits based on a key, performing, at the encoder, protection encoding on the key to generate key protection data, performing, at the encoder, second transition encoding on the key protection data to generate encoded key protection data, and transmitting an encoded series of transmission bits to a receiver, the encoded series of transmission bits including the encoded series of data bits and the encoded key protection data.

The key protection data may include a parity bit.

The generating the encoded key protection data may include inverting the parity bit.

The method may further include: selecting, at the encoder, the key to be a value wherein a most significant bit (MSB) is a constant, and removing the MSB from the key to generate a modified key, wherein the encoded series of transmission bits includes the modified key.

The constant may be a zero.

The key protection data may include a plurality of parity bits.

The plurality of parity bits may be computed according to a Hamming code.

The generating the encoded key protection data may include inverting at least one of the plurality of parity bits.

The method may further include: selecting, at the encoder, the key to be a value wherein an MSB is a constant, and removing the MSB from the key to generate a modified key, wherein the encoded series of transmission bits includes the modified key.

The generating the encoded key protection data may further include inserting one or more bits of the inverted parity bits to a front of the modified key and inserting one or more bits of the inverted parity bits to an end of the modified key.

According to some embodiments, an encoder is described. The encoder may include: an input configured to receive series of data bits, a processor configured to execute operations which may include: performing first transition encoding on the data bits to generate an encoded series of data bits based on a key, performing protection encoding on the key to generate key protection data, and performing second transition encoding on the key protection data to generate encoded key protection data, and an output configured to transmit an encoded series of transmission bits to a receiver, the encoded series of transmission bits including the encoded series of data bits and the encoded key protection data.

The key protection data may include a parity bit.

The generating the encoded key protection data may include inverting the parity bit.

The operations may further include: selecting, at the encoder, the key to be a value wherein a most significant bit (MSB) is a constant, and removing the MSB from the key to generate a modified key, wherein the encoded series of transmission bits includes the modified key.

The constant may be a zero.

The key protection data may include a plurality of parity bits.

The plurality of parity bits may be computed according Hamming code.

The generating the encoded key protection data may include inverting at least one of the plurality of parity bits.

The operations may further include: selecting, at the encoder, the key to be a value wherein an MSB is a constant, and removing the MSB from the key to generate a modified key, wherein the encoded series of transmission bits includes the modified key.

The generating the encoded key protection data further includes inserting one or more bits of the inverted parity bits to a front of the modified key and inserting one or more bits of the inverted parity bits to an end of the modified key.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIG. 2 is table illustrating example code words, according to various embodiments of the present disclosure.

Figure 1:
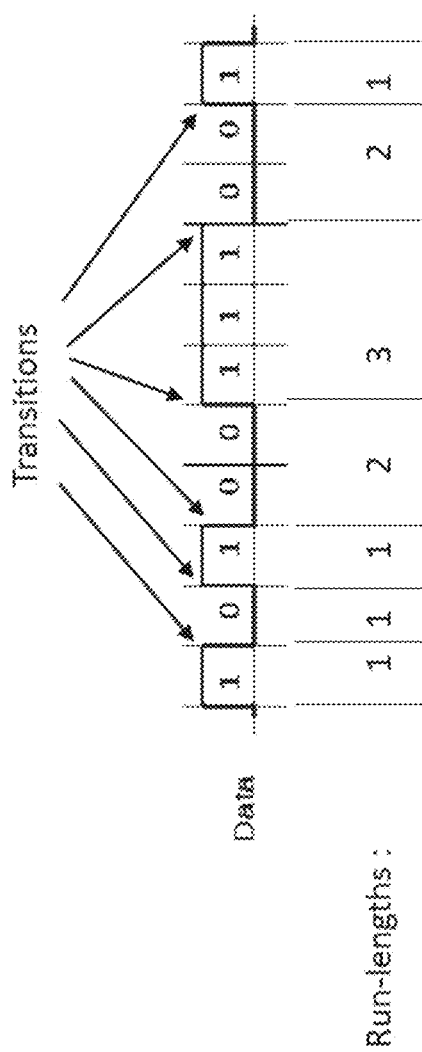
FIG. 1 is an example of a series of data bits illustrating transitions within the data, according to various embodiment of the present disclosure.

Embodiments of the present disclosure and their advantages are best understood by referring to the detailed description that follows. Unless otherwise noted, like reference numerals denote like elements throughout the attached drawings and the written description, and thus, descriptions thereof will not be repeated. In the drawings, the relative sizes of elements, layers, and regions may be exaggerated for clarity.

DETAILED DESCRIPTION

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

In digital communications, an encoder encodes data bits (e.g., data packets) and sends the encoded data bits to a decoder. The decoder then decodes the encoded data bits so that the data bits can be used by a system, such as for example, a television, a display device, a computer, etc. According to one technique, the encoded data bits may be serialized and transmitted from the encoder to the decoder over a serial digital data link. Such serial digital data may be transmitted together with a separate clock signal that accompanies the serial digital data or the serial digital data may be transmitted with a clock signal that is embedded within the serial digital data signal (i.e., without a separate clock signal).

Transition encoding is a method for transmitting serial digital data signal without a separate clock signal. Transition encoding relies on the existence of data transitions in the series of data bits where the data bits transition or change from a zero to a one or from a one to a zero. In other words, a certain amount of transitions must occur within the series of data bits in order for a decoder to properly utilize the received data. However, if a run-length in the series of data exceeds a certain limit, then the decoder may be unable to correctly decode the data and the system will not end up with the data that it was supposed to receive. Run-length refers to the number of consecutive ones or zeros in the series of data bits. For example, in an example series of data bits 10100111001 shown in FIG. 1, the run-lengths between each transition is indicated as 1, 2, or 3. For example, the scenarios where there are three consecutive ones has a run-length of 3.

Some transition encoding techniques include a key (e.g., a scrambling key) that may be used when encoding the data bits to maintain integrity of the encoded series of data bits as the data gets transmitted across a serial data link. In such case, the encoder generates a key, and applies transition encoding to the data bits based on the key, and adds the key to the series of the encoded data bits to generate a series of transmission bits to transmit to the receiver. When the encoded transmission bits are received by the decoder, the decoder decodes the received transmission bits using the key. If the key becomes corrupt during the transmission, the decoder will be unable to decode the transmission data bits, and may result in error propagation. That is, an error in the key carries over into errors in the entire data, thus rendering the entire series of data unusable. Accordingly, embodiments of the present disclosure describe techniques to improve reliability of transmission of the key. Moreover, it may be desirable to protect the key without changing the transition properties of the encoded sequence (e.g., not exceeding the run-length limits of the encoding).

An example transition encoding technique includes encoding 31 sets of 6-bit words of data and a key that is also 6-bits. Thus, according to the embodiment, a series of transmission bits include 192-bits of which 186-bits is the data and 6-bits is the key. The 6-bit key may be denoted D, and D may be a word that is different from all 31 words of the original data words and also different from the complement of the 31 original data words. Accordingly, the value of D may be selected, and an exclusive OR ("XOR") operation may be applied to D and each of the 31 words. Thus, for example, each word of the 186 data bits may be denoted as $x1, x2, \ldots, x31$ and the XOR operation may be applied to each of the words $x1, x2, \ldots, x31$ and the key D to result in $x1\hat{}D, x2\hat{}D, \ldots, x31\hat{}D$. Thus, by performing transition encoding to the series of data words $\{x1, x2, \ldots, x31\}$, the encoded data words will become $\{D, x1\hat{}D, x2\hat{}D, \ldots, x31\hat{}D\}$, wherein the first data word is the key D, followed by each of the 31 data words XOR'd with the key D. Accordingly, the series of transmission data stream becomes 32 words long, wherein the 192-bits are serialized and transmitted over a serial data link. According to this example transition encoding technique, the run-length may be limited to 10. The details for determining the run-length of this transition encoding technique is not relevant to the present disclosure and therefore will not be described here.

When the transmission data series is received by the decoder, the decoder takes the key D and applies an XOR operation to each encoded word (i.e., each of the 31 words). Thus, by XORing D with the first coded word $x1\hat{}D$, the D is canceled, thereby leaving just x1, which is the first word. The same XOR operation is performed on all 31 encoded words to decode the 31 words. Thus, if an error is introduced in to the key D, the error will propagate to each of the 31 words because the decoder will perform an XOR operation using the erroneous (i.e., incorrect) key D.

According to various embodiments of the present disclosure, techniques for protecting the integrity of the key D will be described. In other words, methods and techniques for error detection and/or error correction may be implemented and applied to the key D by the encoder such that if an error results in the key D (e.g., during transmission), the decoder will be able to detect the error in the key D and therefore not apply the erroneous key D to decode the data stream. Instead, the decoder may, for example, wait for another key D to arrive that does not contain the error. In other embodiments, the decoder may not only detect the presence of the error but it may also correct the error so that the decoder does not have to discard the key D and wait for the next key but instead, correct the erroneous key so that the decoder can now use the corrected key right away. It is noted that the techniques for protecting the integrity of a key described in the present disclosure are applicable to various encoding and/or decoding techniques known to those skilled in the art. Such encoding and/or decoding techniques may include utilizing different logical operations, different word sizes, different number of words, etc.

Generally speaking, a parity bit may be included in encoded data to help detect the presence of an error. One example is to generate an even parity bit and include the even parity bit in an encoded data. For example, if there are n bits, d1 to dn, in a given word (e.g., the 6-bit key) or block, then the even parity bit p may be generated or computed by performing an XOR operation on bits d1 to dn. Thus, the even parity bit p of d1 to dn may be shown as: $p=d1 \oplus d2 \oplus d3 \oplus \ldots \oplus dn$, and the encoded block including the even parity bit may be represented as: {d1, d2, d3, ..., dn, p}. Thus, the dependency between the data bits and the parity bit may be written as $d1 \oplus d2 \oplus d3 \oplus \ldots \oplus dn \oplus p=0$. In other words, if the dependency representation equals 0 in the case of an even parity bit, then the data bits d1 to dn likely do not contain an error. On the other hand, if the dependency representation equals 1, then there is a likelihood that one of the data bits d1 to dn contains an error.

More complicated block codes may be constructed by including multiple parity bits. For example, Hamming codes, such as a (7, 4) Hamming code may be used. In a (7,4) Hamming code, three parity bits may be implemented in a block of encoded data bits. In such case, the parity bits p1, p2, p3 may be generated as:

$$p1=d1 \oplus d2 \oplus d4,$$

$$p2=d1 \oplus d3 \oplus d4,$$

$$p3=d2 \oplus d3 \oplus d4,$$

and the dependencies between the parity bits and the data bits may be represented as:

$$d1 \oplus d2 \oplus d4 \oplus p1=0,$$

$$d1 \oplus d3 \oplus d4 \oplus p2=0,$$

$$d2 \oplus d3 \oplus d4 \oplus p3=0.$$

Another example of a parity bit is an odd parity bit. In an odd parity pb, application of an XOR operation to the data bits and the odd parity bit results in a 1, which may be represented as $d1 \oplus d2 \oplus d3 \oplus \ldots \oplus dn \oplus pb=1$. Thus, odd parity bit pb may be generated as: $pb=inv(d1 \oplus d2 \oplus d3 \oplus \ldots \oplus dn)$. That is, the odd parity bit is the inverse of the result of an XOR operation of all the data bits.

In transition encoding, odd parity bit includes some useful features. For example, if the block consists of an odd number of bits, that is, n is odd, then there is a guaranteed transition in the block of data bits. That is, if d1=0, d2=0, d3=0, d4=0, d5=0, then $pb=inv(d1 \oplus d2 \oplus d3 \oplus d4 \oplus d5)=inv(0 \oplus 0 \oplus 0 \oplus 0 \oplus 0)=inv(0)=1$. Therefore, if the odd parity bit is inserted at the end of the code, then the block code is 000001, which includes a transition. Similarly, if d1=1, d2=1, d3=1, d4=1, d5=1, then $pb=inv(d1 \oplus d2 \oplus d3 \oplus d4 \oplus d5)=inv(1 \oplus 1 \oplus 1 \oplus 1 \oplus 1)=inv(1)=0$. Therefore, the block code is 111110, which also includes a transition. Accordingly, in the worst-case scenario where bits d1 to do are all ones or all zeros, where n is odd, the run-length is limited to n, and the inclusion of the odd parity bit guarantees a transition.

Now turning back to the example transition encoding technique that uses 31 sets of 6-bit words and a 6-bit key D, the concept of using an odd parity bit may be applied to the key D to detect error and in some embodiments, detect and correct an error. According to this example, the key D comprises 6-bits and the most significant bit ("MSB") (i.e., the 6th bit) of the value of key D is always zero. Thus, according to an embodiment of the present disclosure, the 6th bit of the key D may be removed and replaced with an odd parity bit instead of a zero. For example, the decoder knows that the MSB of the value of key D is always zero. Therefore, when the decoder receives the encoded key D, even though the actual value of the MSB (i.e., 0) is replaced with the odd parity bit, the decoder may remove the parity bit from the MSB and replace it with a zero during the decoding process.

Accordingly, by removing the 0 from the MSB of key D and replacing it with the odd parity bit, the encoded key D now includes five bits that correspond to the key data, and 1 bit (i.e., the 6th bit) for the odd parity bit. For example, the key D may be represented as D=d1, d2, d3, d4, d5, pb, wherein pb corresponds to the odd parity bit where $pb=inv(d1 \oplus d2 \oplus d3 \oplus d4 \oplus d5)$. Accordingly, the relationship between the odd parity bit and the five data bits is: $d1 \oplus d2 \oplus d3 \oplus d4 \oplus d5 \oplus pb=1$. Thus, if there is an error in any one of the data bits of the key D, then the odd parity dependency will no longer hold true and will therefore reveal that there is an error in one of the data bits d1, d2, d3, d4, or d5.

Additionally, the run-length is limited to 5 because, as explained above, in the worst-case scenario where all of the data bits d1 to d5 are ones, the odd parity bit is zero, or if all of the data bits d1 to d5 are zeros, then odd parity bit is one. Thus, the run-length is not greater than 5, which falls within the run-length limit of 10 as previously indicated for this example transition encoding technique. However, while the implementation of one odd parity bit is able to detect the presence of an error, the specific location of the error is not determinable in this example. It should be noted that the above described embodiment is merely an example to explain the aspects of the embodiment and is not intended to be limited. Thus, the same or similar technique may be adapted to other schemes in which the words have different numbers of bits, different run-length limits, etc. For example, in other embodiments, a word may have 8 bits and the run-length limit may be 9.

According to another embodiment of the present disclosure, multiple parity bits may be included with the key D to further improve the integrity of the key. For example, similar to the above example key D that includes 6-bits, where the MSB is always zero, the 6th bit may be dropped and four additional odd parity bits may be included. Accordingly, the new key D is 9-bits, wherein 5-bits are the data bits and 4-bits are the parity bits. In some embodiments, four odd parity bits, may be generated and inserted to the block. For example, the four odd parity bits may be generated as follows:

$$pb1=inv(d1 \oplus d2 \oplus d3),$$

$$pb2=inv(d1 \oplus d3 \oplus d4),$$

$$pb3=inv(d2 \oplus d3 \oplus d5),$$

$$pb4=inv(d3 \oplus d4 \oplus d5).$$

Accordingly, by generating and including four parity bits, if there is an error in one of the data bits, then the dependency of the parity bits will no longer hold true and therefore will reveal that there is an error. Furthermore, because there are four parity bits, depending on which dependency equations no longer hold true, the system can determine which of the five data bits is erroneous, and then correct the erroneous bit. For example, if the error is in d1, then the dependency equation that includes pb1 and pb2 will be invalid. If the error is in d2, then the dependency equation includes pb1 and pb3 will be invalid. If the error is in d3, then the dependency equation includes pb1, pb2, pb3, and pb4 will be invalid. If the error is in d4, then the dependency equation includes pb2 and pb4 will be invalid. If the error is in d5, then the dependency equation includes pb3 and pb4 will be invalid. Accordingly, the system is able to pinpoint precisely the erroneous bit and then correct erroneous bit because the bits are binary and if the erroneous bit is a zero, it becomes a one, and if it is a one, then it becomes a zero. In some embodiments, if there are two errors in the data bits, then the system is able to detect the error but would not be able to precisely determine the erroneous bits to correct the errors. Instead, the error would just be detected.

In some embodiments, the 9-bit key is arranged such that the first two bits and the last two bits are the parity bits and the middle five bits are the data bits. Thus, the key including the odd parity bits may be represented as pb1, pb2, d1, d2, d3, d4, d5, pb3, pb4. By arranging the data bits and the parity bits in this manner, the run-length may be limited to 5 and transitions may be guaranteed in the key D. FIG. 2 is a chart that illustrates every combination of the data bits of key D. Because there are 5 data bits, there are 32 possible combinations. As indicated with shaded boxes, the run-length limit is 5, when all of the data bits are zeros and when all of the data bits are ones. Accordingly, the run-length limit satisfies the run-length limit of 10 of the example transition encoding technique described in the present disclosure, and accordingly, the likelihood of errors and error propagation in a serial data link may be reduced.

Figure 3:
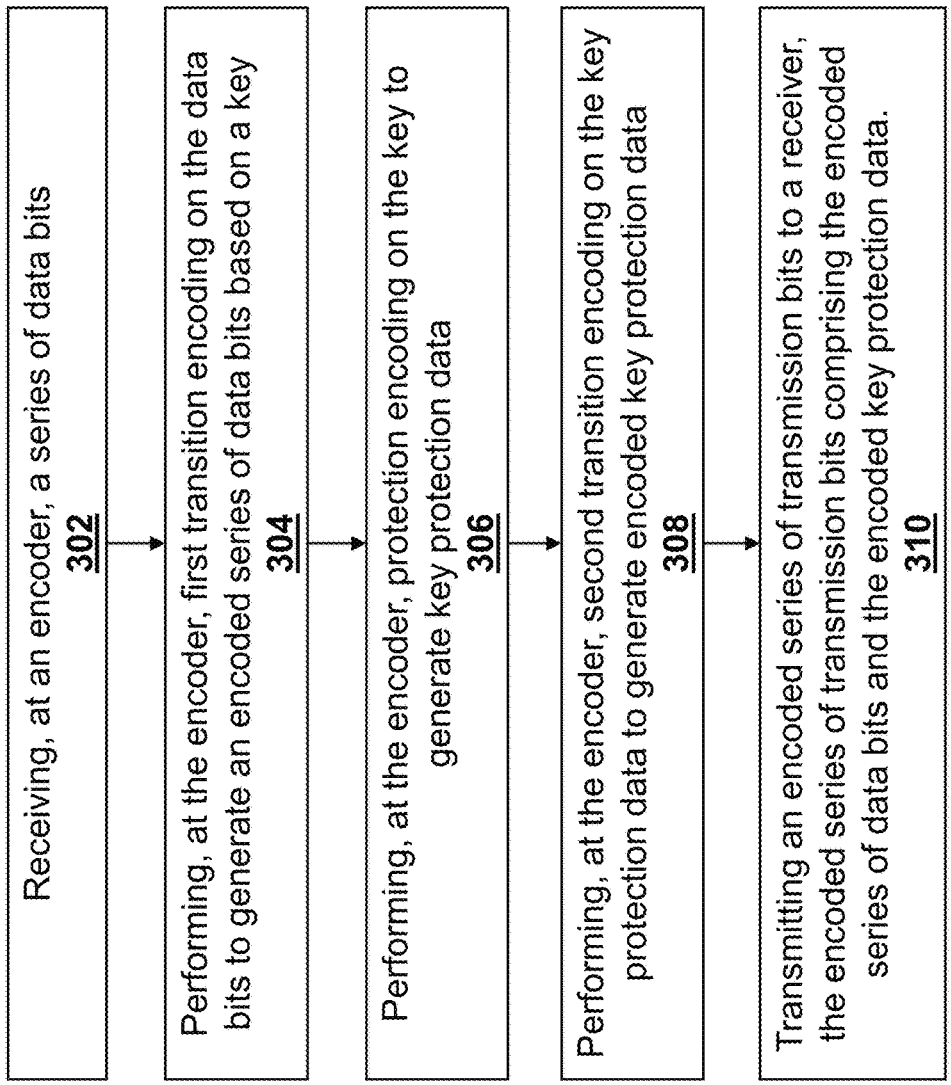
FIG. 3 is a flow chart illustrating the step for encoding a series of data bits, according to various embodiment of the present disclosure.

FIG. 3 is a flow chart illustrating the steps for encoding a series of data bits, according to various embodiment of the present disclosure. According to an embodiment, an encoder is configured to receive a series of data bits that is to be encoded and transmitted to a receiver (302). In some embodiments, the data may be packets of data whereas in other embodiments, the data may be any serial data with an embedded clock signal. The series of data bits that are received at the encoder may be encoded by performing a first transition encoding on the data bits, which generates an encoded series of data bits based on a key (304). In some embodiments, the value of the key may be used to perform an XOR operation with the data bits to generate the encoded series of data bits. Thus, when the data bits are to be decoded, the decoder relies on the key to perform the decoding operations. Accordingly, the key is important and the integrity of the key should be protected so that an error is not introduced into the key, for example, during transmission. Moreover, if the key results in an error, then it is desirable to detect the presence of an error and in some instances, correct the error. Accordingly, the encoder may be configured to perform protection encoding to the key to generate a key protection data (306).

In some embodiments, the key protection data is a parity bit. For example, an odd parity bit may be generated by performing an XOR operation on each bit of the key and taking the inverse of the result. Thus, if the key comprises bits d1, d2, . . . dn, then the odd parity bit (pb) may be represented as: pb=inv(d1⊕d2 ⊕ . . . ⊕dn).

Once the odd parity bit is generated, the encoder may perform a second transition encoding on the key protection data (e.g., the odd parity bit) to generate an encoded key protection data (308). In some embodiments, the encoded key protection data may be represented as the key bits with the addition of the key protection data. In other words, if the key protection data is an odd parity bit pb, and the key comprises an odd number of bits d1, d2, . . . dn, wherein n is odd, then the encoded key protection data may be represented as d1, d2, . . . dn, pb. In other embodiments where the parity bits are computed according to a Hamming code, the encoded key protection data may be represented, for example, as d1, d2, . . . dn, p1, p2, p3. Once the encoded key protection data is generated, the encoded series of data bits and the encoded key protection data may be combined into an encoded series of transmission bits and transmitted to a receiver (310). The transmitter and the receiver may be coupled with a serial data link and the encoded series of transmission bits may be transmitted from the transmitter to the receiver via the serial data link. In some embodiments, the receiver may include a decoder that receives the encoded series of transmission bits and decodes it using the key. To reduce error propagation, the integrity of the key may be verified by using the included key protection data (e.g., the odd parity bit) to ensure the value of the key corresponds with the odd parity bit.

Figure 4:
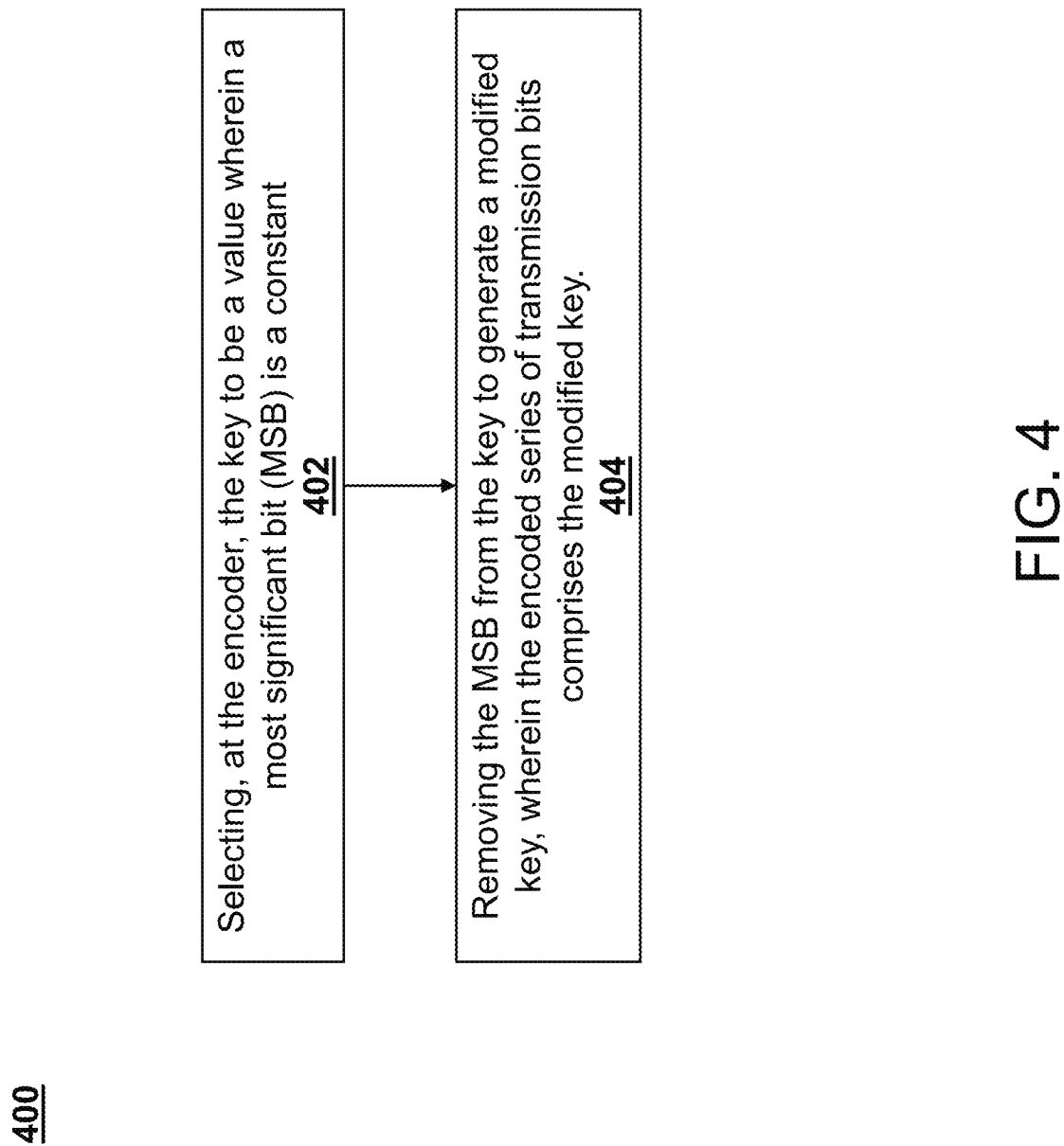
FIG. 4 is a flow chart illustrating the steps for encoding the key protection data, according to various embodiment of the present disclosure.

FIG. 4 is a flow chart illustrating the steps for encoding the key protection data, according to various embodiment of the present disclosure. According to an embodiment, the key may be selected such that the key protection data may be encoded with it. For example, the key may be selected by the encoder such that the most significant bit (MSB) of the value of the key is a constant (e.g., always one or always zero) (402). Therefore, by selecting a key wherein the MSB is always the same value, the MSB does not necessarily have to be transmitted to the receiver because the receiver may be configured to know that the MSB of the value of the key to always be the same value. For example, if the selected key is a 6-bit value, and the MSB of the 6-bits (i.e., the 6th bit) is always a zero, then the 6th bit may be removed. Instead, the MSB may be replaced by the key protection data (e.g., odd parity bit), therefore making better use of the bandwidth taken up by the bits. Accordingly, the modified key may be generated, and the modified key may be included in the transmission bits (404).

In some embodiments, the key protection data may include a plurality of parity bits, which improves the integrity of the key by being able to detect multiple errors in the key as well as correct the error. For example, in some embodiments, the key protection day may include Hamming codes. Accordingly, catastrophic error propagation at the receiver may be reduced by optimizing serial data transmission while conforming with run-length requirements.

Figure 5:
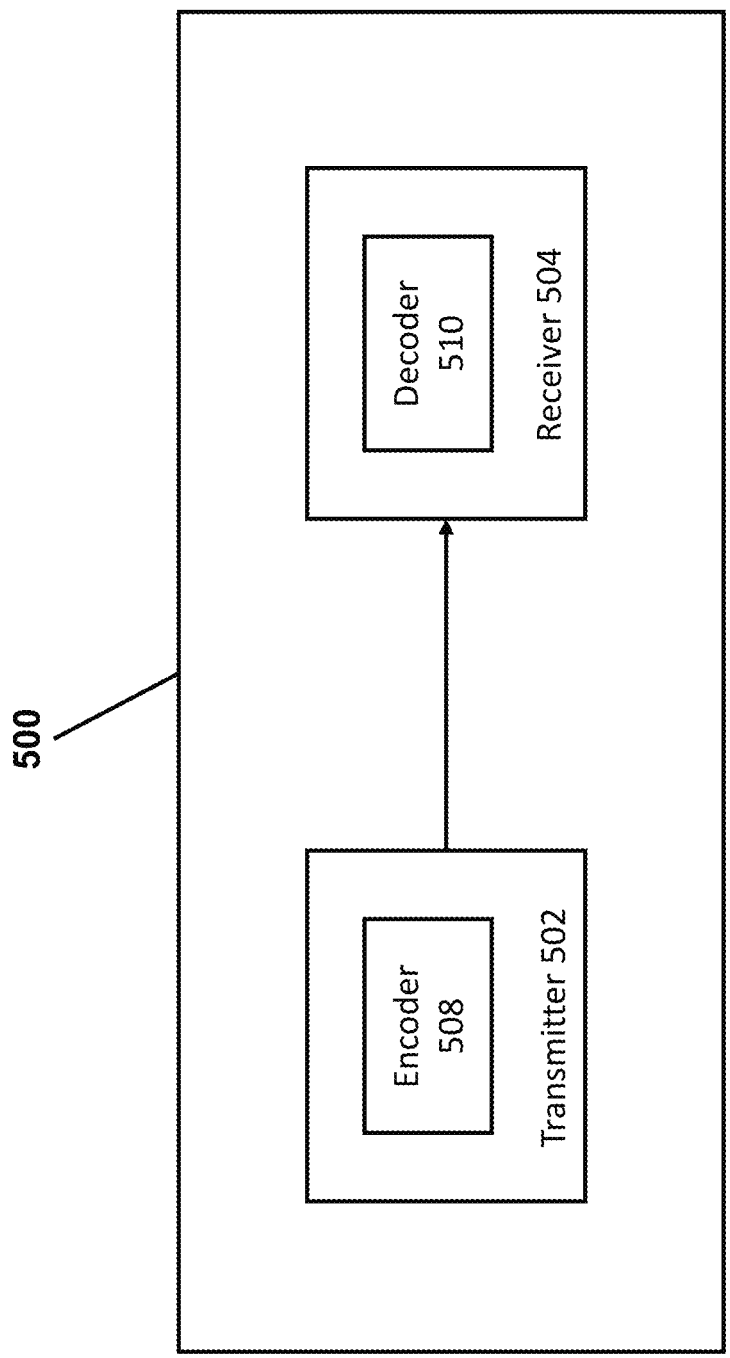
FIG. 5 is a block diagram of an electronic system, according to various embodiments of the present disclosure.

FIG. 5 is an example block diagram of an electronic system 500. By way of example and not of limitation, the system 500 may be a television or a display device, and may include at least a transmitter 502 and a receiver 504 that may be configured to communicate with each other, for example, via a high-speed digital serial link 506. In some embodiments, the transmitter 502 may include an encoder 508 that takes data (e.g., digital data) that may be generated within the system 500 or received from another source (e.g., external source), and encodes the data and then transmits the encoded data to the receiver 504. The receiver 504 may be in communication with the display drivers that control, for example, pixels in the display device which are illuminated according to the received data. The receiver 504 may include a decoder 510 that receives the encoded data from the transmitter 502 over the link 506, and decodes 510 the encoded data so that the data may be utilized by the system 500. In some embodiments, the encoder 508 may be a transition encoder to perform transition encoding such as the techniques described according to various embodiments of the present disclosure. Yet in other embodiments, the encoder 508 may be configured to perform other digital encoding techniques known to those skilled in the art. It should be noted that the illustrated electronic system 500 is merely one example of an electronic system that utilizes high-speed serial data transmission that relies on accuracy of transmitted data, but that a person having ordinary skill in the art would appreciate that other systems may be contemplated.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g., an application-specific integrated circuit), software, or a combination of software, firmware, and hardware, to process data or digital signals. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Circuit hardware may include, for example, application specific integrated circuits (ASICs), general purpose or special purpose central processing units (CPUs) that is configured to execute instructions stored in a non-transitory storage medium, digital signal processors (DSPs), graphics processing units (GPUs), and programmable logic devices such as field programmable gate arrays (FPGAs).

Further, the various components of these devices may be a process or thread, running on one or more processors, in one or more computing devices, executing computer program instructions and interacting with other system components for performing the various functionalities described herein. The computer program instructions are stored in a memory that may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Embodiments described herein are examples only. One skilled in the art may recognize various alternative embodiments from those specifically disclosed. Those alternative embodiments are also intended to be within the scope of this disclosure. As such, the embodiments are limited only by the following claims and their equivalents.

What is claimed is:

1. A method by an electronic device configured to decode data received from an encoder, the method comprising:
    receiving, by a decoder of the electronic device, transmission bits comprising a transition encoded series of data bits and a transition encoded key protection data;
    decoding, by the decoder, the transition encoded key protection data to generate a key protection data;
    determining that a key is accurate based on the key protection data; and
    decoding, by the decoder, the transition encoded series of data bits to generate decoded series of data bits, based on the accurate key.

2. The method of claim 1, wherein the transition encoded key protection data comprises an inverted parity bit.

3. The method of claim 2, wherein the generating the key protection data comprises inverting the inverted parity bit.

4. The method of claim 3, wherein a most significant bit (MSB) of the transition encoded key protection data comprises the key protection data, the method further comprising replacing the MSB with a constant to generate the key.

5. The method of claim 4, wherein the constant is a zero.

6. The method of claim 1, wherein the key protection data comprises a plurality of parity bits.

7. The method of claim 6, wherein the plurality of parity bits are based on a Hamming code.

8. The method of claim 6, wherein the generating the key protection data comprises inverting at least one of a plurality of inverted parity bits.

9. The method of claim 8, wherein an MSB of the transition encoded key protection data comprises the key protection data, the method further comprising replacing the MSB with a constant to generate the key.

10. The method of claim 9, wherein the decoding the transition encoded key protection data further comprises removing one or more bits of the inverted parity bits from a front of the key and removing one or more bits of the inverted parity bits from an end of the key.

11. A decoder in an electronic device configured to decode data received from an encoder, comprising:
    an input configured to receive a series of transmission bits comprising a transition encoded series of data bits and a transition encoded key protection data; and
    a processor configured to execute operations comprising:
        decoding the transition encoded key protection data to generate a key protection data;
        determining that a key is accurate based on the key protection data; and
        decoding the transition encoded series of data bits to generate decoded series of data bits, based on the accurate key.

12. The decoder of claim 11, wherein the transition encoded key protection data comprises an inverted parity bit.

13. The decoder of claim 12, wherein the generating the key protection data comprises inverting the inverted parity bit.

14. The decoder of claim 13, wherein a most significant bit (MSB) of the transition encoded key protection data comprises the key protection data, the operations further comprising replacing the MSB with a constant to generate the key.

15. The decoder of claim 14, wherein the constant is a zero.

16. The decoder of claim 11, wherein the key protection data comprises a plurality of parity bits.

17. The decoder of claim 16, wherein the plurality of parity bits are based on a Hamming code.

18. The decoder of claim 16, wherein the generating the key protection data comprises inverting at least one of a plurality of inverted parity bits.

19. The decoder of claim 18, wherein an MSB of the transition encoded key protection data comprises the key protection data, the operations further comprising replacing the MSB with a constant to generate the key.

20. The decoder of claim 19, wherein the decoding the transition encoded key protection data further comprises removing one or more bits of the inverted parity bits from a front of the key and removing one or more bits of the inverted parity bits from an end of the key.

* * * * *